(12) United States Patent
Riester et al.

(10) Patent No.: US 8,417,078 B2
(45) Date of Patent: Apr. 9, 2013

(54) PRINTED CIRCUIT BOARD ELEMENT INCLUDING AN OPTOELECTRONIC COMPONENT AND AN OPTICAL WAVEGUIDE

(75) Inventors: Markus Riester, Seiersberg (AT); Gregor Langer, Graz (AT); Alexander Stuck, Wettingen (CH)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 0 days.

(21) Appl. No.: 12/297,066

(22) PCT Filed: May 8, 2007

(86) PCT No.: PCT/AT2007/000216
§ 371 (c)(1),
(2), (4) Date: Jun. 24, 2009

(87) PCT Pub. No.: WO2007/128021
PCT Pub. Date: Nov. 15, 2007

(65) Prior Publication Data
US 2009/0310905 A1    Dec. 17, 2009

(30) Foreign Application Priority Data
May 8, 2006   (AT) .................................. A 792/2006

(51) Int. Cl.
*G02B 6/42*    (2006.01)
(52) U.S. Cl.
USPC .................................. 385/47; 385/14; 385/39

(58) Field of Classification Search ............ 385/14, 385/39, 47
See application file for complete search history.

(56) References Cited

U.S. PATENT DOCUMENTS

| | | | |
|---|---|---|---|
| 5,072,421 A * | 12/1991 | Ono et al. ..................... 365/10 |
| 5,125,054 A * | 6/1992 | Ackley et al. .................. 385/49 |
| 5,369,529 A | 11/1994 | Kuo et al. |
| 6,343,171 B1 | 1/2002 | Yoshimura et al. |
| 6,690,845 B1 * | 2/2004 | Yoshimura et al. ............ 385/14 |
| 6,912,332 B2 * | 6/2005 | Han et al. ........................ 385/14 |
| 7,162,109 B2 * | 1/2007 | Nakada et al. ................... 385/2 |
| 7,221,829 B2 * | 5/2007 | Oono et al. ..................... 385/52 |

(Continued)

FOREIGN PATENT DOCUMENTS

| | | |
|---|---|---|
| CN | 1 475 824 A | 2/2004 |
| DE | 37 06 255 | 9/1988 |

(Continued)

OTHER PUBLICATIONS

Official Action for Application No. 2009-508041 dated Mar. 6, 2012 with English translation.

(Continued)

*Primary Examiner* — Kaveh Kianni
(74) *Attorney, Agent, or Firm* — Ladas & Parry LLP

(57) ABSTRACT

The invention relates to a printed circuit board element (10) including at least one optoelectronic component (1) which is embedded in an optical, photopolymerizable layer material (13), and at least one optical waveguide (14) optically coupled thereto, which is structured in the optical, photopolymerizable material (13) by photon irradiation, wherein the component (1) comprises a curved deflection mirror (5) on its light transmission surface (3), which curved deflection mirror deflects the light radiation (15), for instance by 90°.

20 Claims, 9 Drawing Sheets

U.S. PATENT DOCUMENTS

| | | | |
|---|---|---|---|
| 7,242,828 B2* | 7/2007 | Oda et al. | 385/31 |
| 7,250,317 B2* | 7/2007 | Heideman | 438/31 |
| 7,260,328 B2* | 8/2007 | Kropp | 398/82 |
| 7,272,270 B2* | 9/2007 | Nakada et al. | 385/2 |
| 7,298,941 B2* | 11/2007 | Palen et al. | 385/33 |
| 7,599,277 B1* | 10/2009 | Kato et al. | 369/112.27 |
| 2001/0004413 A1 | 6/2001 | Aihara | |
| 2001/0053260 A1* | 12/2001 | Takizawa et al. | 385/14 |
| 2002/0028045 A1* | 3/2002 | Yoshimura et al. | 385/50 |
| 2003/0002101 A1* | 1/2003 | Kropp et al. | 359/124 |
| 2003/0142896 A1* | 7/2003 | Kikuchi et al. | 385/14 |
| 2003/0152113 A1* | 8/2003 | Kropp | 370/535 |
| 2003/0156327 A1* | 8/2003 | Terakawa et al. | 359/592 |
| 2004/0005119 A1* | 1/2004 | Han et al. | 385/49 |
| 2004/0131302 A1* | 7/2004 | Kouta et al. | 385/14 |
| 2004/0156640 A1* | 8/2004 | Dress et al. | 398/140 |
| 2004/0184737 A1* | 9/2004 | Oono et al. | 385/52 |
| 2005/0052751 A1* | 3/2005 | Liu et al. | 359/626 |
| 2005/0069253 A1* | 3/2005 | Heideman | 385/31 |
| 2005/0220386 A1* | 10/2005 | Nakada et al. | 385/1 |
| 2005/0276072 A1* | 12/2005 | Hayashi et al. | 362/609 |
| 2006/0125978 A1* | 6/2006 | Hiyama et al. | 349/96 |
| 2006/0239605 A1* | 10/2006 | Palen et al. | 385/14 |
| 2006/0251357 A1* | 11/2006 | Dietrich et al. | 385/31 |
| 2006/0269182 A1* | 11/2006 | Nakada et al. | 385/1 |
| 2008/0044127 A1 | 2/2008 | Leising et al. | |
| 2009/0232443 A1* | 9/2009 | Oda et al. | 385/14 |
| 2010/0279446 A1* | 11/2010 | Henrichs | 438/31 |

FOREIGN PATENT DOCUMENTS

| | | |
|---|---|---|
| EP | 1 004 907 | 5/2000 |
| EP | 1 109 041 | 6/2001 |
| EP | 1109041 A1 * | 6/2001 |
| EP | 1 387 193 A1 | 2/2004 |
| EP | 1 651 018 A1 | 4/2006 |
| JP | 61-133911 | 6/1986 |
| JP | 2-234476 | 9/1990 |
| JP | 7-128531 A | 5/1995 |
| JP | 2000-114581 A | 4/2000 |
| JP | 2001-141965 A | 5/2001 |
| JP | 2001-174671 A | 6/2001 |
| JP | 2004-177985 A | 6/2004 |
| JP | 2005-338696 A | 12/2005 |
| TW | 231 925 B | 5/2005 |
| TW | 241 544 B | 10/2005 |
| WO | 2005/064381 | 7/2005 |
| WO | 2005/064381 A1 | 7/2005 |
| WO | 2006/012819 | 2/2006 |

OTHER PUBLICATIONS

Espacenet English abstract of JP 2005-338696 A.
Espacenet English abstract of JP 2004-177985 A.
Espacenet English abstract of JP 2001-141965 A.
Espacenet English abstract of JP 2000-114581 A.
Espacenet English abstract of JP 2001-174671 A.
Espacenet English abstract of JP 7-128531A.
Office Action in respect of counterpart EP Application No. 07 718 430.7-1524.
Summary of Office Action issued for the corresponding Taiwanese application.
espacenet English abstract of CN 1 475 824 A.
espacenet English abstract of TW I 231 925 B.
espacenet English abstract of TW I241544 B.
Office Action issued by the EPO dated Oct. 31, 2012 for Application No. EP 07 718 430.7-1524 and English translation thereof.

* cited by examiner

PRINTED CIRCUIT BOARD ELEMENT INCLUDING AN OPTOELECTRONIC COMPONENT AND AN OPTICAL WAVEGUIDE

The invention relates to a printed circuit board element including at least one optoelectronic component such as, e.g., a VCSEL component or a photodiode, which is embedded in an optical photopolymerizable layer material, and at least one optical waveguide optically coupled thereto, said optical waveguide being structured in the optical photopolymerizable material by photon irradiation.

The invention is further related to an optoelectronic component such as, e.g., a VCSEL component or a photodiode, including a light transmission surface.

Optoelectronic (semiconductor) components such as, e.g., VCSEL (vertical cavity surface emitting laser) components frequently emit their light or laser radiation vertically to the substrate, i.e. at a right angle to their desired or normal installation direction. In that direction of emission, the structural height of the optoelectronic component is the lowest, whereas the dimensions perpendicular to the direction of emission are larger, amounting, in particular, to a multiple of the thickness dimensions of the structural components. This creates problems at the integration of such a component into a printed circuit board element including an optical waveguide, since the insertion into the substrate will have to be effected on edge, if the emission of light is desired to occur parallelly with the main plane of the printed circuit board element. However, such an on-edge insertion involves problems in that it cannot be realized in the course of an automated standard insertion. Furthermore, contacting of the components is difficult, requiring in particular complex, expensive bonding wire connections. Moreover, such an on-edge insertion results in relatively large dimensions of the printed circuit board elements in the thickness direction, wherein, however, small dimensions are, as a rule, sought in said thickness direction.

From US 2003/0156327 A, a flat, plate-shaped light deflection element is known, which has a curved mirror surface perpendicular to the main plane of the plate in order to deflect light supplied to an entry surface from a separate component, e.g. a fiber optic cable, in the plane of the plate-shaped light deflection element by about 90° to an exit surface, where a further separate component will receive the light. This light deflection element, too, would have to be arranged on edge if installed in a printed circuit board element, in order to deflect light from an optoelectronic component radiating vertically to the substrate into the plane of the printed circuit board element. In addition, the installation of this separate deflection element would be elaborate also in terms of placement with the required accuracy. This drawback correspondingly also applies to the separate mirror elements provided in the assemblies according to JP 61-133 911 A, where a prefabricated mirror is attached to a LED—or photodetector—component, and according to DE 37 06 255 A, where a light-ignitable thyristor receives a light signal supplied via a rigid light deflector separated from the thyristor, e.g. a prism or a glass bend following upon a flexible optical fiber.

From WO 01/16630 A1, a multilayer printed circuit board element is known, in which optoelectronic components, in particular VCSEL components, are provided in connection with an optical waveguide. There, a remedy to enable a flat installation of the VCSEL components into the printed circuit board was seen in the incorporation of the respective VCSEL component in a buffer layer adjacent an optical waveguide layer, and in the arrangement of a planar, inclinedly positioned deflection mirror in the waveguide layer to deflect the emitted laser beam by 90° into the waveguide layer. With that mode of construction, the orientation of the VCSEL component and the associated deflection mirror is, however, critical. Furthermore, an area-like optical waveguide layer is provided between buffer layers, within which the laser beam has to be oriented by the aid of the deflection mirror. To this end, it is, therefore, also necessary that a narrow, bundled laser beam is generated by the VCSEL component and propagated by the deflection mirror.

On the other hand, it has already been known to generate an optical waveguide structure in an organic or inorganic optical, photopolymerizable material by the aid of photon absorption processes, whereby the optical material, while being irradiated with photons, is locally converted in a manner as to have a larger refractive index than the original, unstructured optical material. This is known in the context of optocoupler components, for instance, from WO 01/96915 A2, WO 01/96917 A2 and U.S. Pat. No. 4,666,236 A. Comparable waveguide structuring in an optical, photopolymerizable layer in connection with a printed circuit board element, has already been known further from WO 2005/064381 A1, the technique described therein forming the basis of the present invention. A printed circuit board element including a VCSEL component is, in particular, disclosed in connection with FIG. 15 of that WO 2005/064381 A1, wherein the VCSEL component is likewise flatly integrated in the printed circuit board element so as to radiate vertically upwards in the transverse direction of the printed circuit board element. In order to allow the laser beam to subsequently propagate in a horizontal optical waveguide, in the plane of the printed circuit board element, that known technique requires a vertical optical waveguide portion to adjoin the VCSEL component and to be followed by a bow-shaped bend portion of the optical waveguide, which passes over into the horizontal waveguide, from which, however, a relatively large thickness of the printed circuit board element will again inevitably result. That configuration involves problems primarily in respect to the described waveguide structuring by a multi-photon absorption process, since the technique of photon irradiation would, as a rule, cause only slight refractive index differences. Thus structured optical waveguides, which are basically preferred because of their light bundling effect similar to that of optical fibers, consequently involve the drawback of being able to conduct light only around curves having relatively large radii. A deflection of light by 90° would, therefore, require radii (and hence also optical material layer thicknesses) of several millimeters to centimeters and, hence, result in large thicknesses of the printed circuit board elements.

Furthermore, it is, for instance, known from EP 1 512 993 A1 and from EP 1 460 738 A2 to produce in optoelectronic components, by a replication method, optical lenses, for instance for the adjustment of the angle of divergence of a VCSEL component by means of diffractive optics. To this end, a molding process for molding a plurality of lenses on a VCSEL wafer by using an appropriate mold and lens material curing by UV radiation after molding are employed.

On the other hand, JP 02-234 476 A already proposed a LED semiconductor component having an integrated deflection mirror formed by the semiconductor material of the component and deflecting light to an optical fiber. The production of that deflection mirror apparently takes place by a photo-etching technique, which is common in semiconductor technology.

The object of the invention is to provide a printed circuit board element and an optoelectronic component as indicated in the beginning, which enable in a productionally simple and cost-effective manner the emission or reception of light in a planar assembly of components and optical waveguides parallel with the surface on which the respective component is placed flat, so as to enable the achievement of a simple standard insertion and contacting operation as well as extremely small overall structural heights of the printed circuit board elements. Furthermore, the invention also endeavors to focus light simultaneously with the deflection in the region of the optoelectronic component.

To solve this object, the invention provides a printed circuit board element and an optoelectronic component as indicated in the independent claims. Advantageous embodiments and further developments are defined in the dependent claims.

By the technique proposed according to the invention, the aforementioned objects are achieved in an advantageous manner, and an optoelectronic component as well as a printed circuit board element including such an optoelectronic component are provided to enable the coupling of light into the optical waveguide (or from the optical waveguide into the component) in a manner that the insertion of the optoelectronic components into the printed circuit board elements by an automated procedure, simple contacting (e.g. contacting of the lower side by the aid of a conductive adhesive during insertion and/or subsequent contacting of the upper side through μ-vias) will be feasible; besides, an extremely flat mode of construction and, hence, an extremely slight thickness of the printed circuit board element in which such a component including an integrated deflection mirror is embedded will be achieved while, on the other hand, cost-effective production will be ensured. Simultaneously with the deflection of the light, the deflection mirror advantageously also enables the focussing of the beam, particularly into the waveguide, which constitutes a particular advantage in the technique of structuring optical waveguides by using the described photon process, which is to be preferred per se. In the printed circuit board element according to the invention, the optoelectronic component with its optical assembly, namely the deflection mirror, is embedded in an optical material as opposed to VCSEL components according to the prior art including lenses, where an aerial use is envisaged while operating with diffractive optics. The commonly used optical replication material for the optical assembly (lenses according to the prior art, deflection mirror according to the present invention), e.g. a sol-gel material, has a refractive index of about n=1.5. This refractive index of about 1.5 will do to obtain an adequate lens effect in air (with a refractive index n=1). If, however—as in the technique according to the invention—the system is embedded in an optical material likewise having a refractive index of about 1.5, diffractive optics cannot be employed, but refractive optics will be applied. The deflection mirror, in particular, is mirrored on its outer side, for instance, by applying a thin metal layer. The focussing of the light beam is advantageously accomplished by an aspheric mirror.

The deflection mirror according to the invention, which provides a beam deflection by, for instance, 90° as well as focussing, has rendered feasible the production of integrated optical connections in printed circuit board elements as described in detail in the above-mentioned WO 2005/064381 A1. For a detailed explanation of such systems, it is referred to that WO document, the disclosure of which is to be incorporated herein by reference, in particular also with respect to the known TPA (two-photon absorption) process used for waveguide structuring.

The optically transparent material of the deflection mirror is, in particular, a UV-curing material in order to enable its production on the component-semiconductor wafer in a replication method as known per se, and by subsequent UV curing after molding. The material may include a silicone material or an inorganic-organic hybrid polymer such as is known under the name of Ormocer®, i.e. an organically modified ceramic metal, particularly a hybrid polymer based on silicone, of an organic polymer and of glass or ceramics. On the other hand, the transparent material of the deflection mirror may also be a simple thermoplastic or even duroplastic material such as, e.g., polycarbonate, polymethylmethacrylate or polystyrene, or cured epoxy or polyester resins. The focal distance of the deflection mirror may, for instance, be 5000 μm at most and, for instance, between 50 μm and 5000 μm. Gold and silver may, in particular, be used as the metal for mirroring the deflection mirror on its rear side, the layer thickness of this metal layer ranging, for instance, from about 100 nm to some μm.

In particular where the deflection mirror also causes the bundling or focussing of the (laser) beam, it is, moreover, possible in an advantageous manner that the structured optical waveguide ends at a distance in front of the deflection mirror. This is of advantage in the production of an optical waveguide by photon irradiation (two- or multi-photon absorption), since the photon irradiation may optionally be stopped even closely before reaching the deflection mirror or component so as to exclude any risk to the component.

When structuring an optical waveguide within the optical layer, it may advantageously be proceeded in a manner (cf. WO 2005/064381 A1) that the optoelectronic component already embedded in the optical layer is targeted by a camera or similar observation unit and detected as to its position; via this observation unit, an irradiation unit including a lens system will then be activated to move the focus region of the emitted photon beam, in particular laser beam, in the plane of the printed circuit board element, i.e. in the x/y plane, on the one hand, and to adjust the same also in terms of depth within the optical layer, i.e., in the z-direction, on the other hand. By using the respective optoelectronic component as a reference element, the optical waveguide can, thus, be structured in the desired manner within the optical layer, for instance as a simple, linear, optical waveguide connection or as a waveguide structure having branches, curvatures or similar structures and, in particular, even as a three-dimensional structure. The cross-sectional dimensions of the thus structured optical waveguide may, for instance, be in the order of some micrometers, wherein the cross section of such a structured optical waveguide may, for instance, be circular, but also elliptical or rectangular; the exact shape can be determined by the photon beam and its focus control.

The technique according to the invention for structuring waveguides preferably uses the already mentioned photon process, which is known per se and in which a chemical reaction (e.g. polymerization) is activated by the simultaneous absorption of two (or more) photons. In doing so, it is advantageous that, due to the transparency of the optical material for the excitation wavelength, all points within a volume will be reached so as to readily enable the writing of three-dimensional structures into said volume, whereby very small focus regions and, hence, very small structural dimensions can, furthermore, be achieved. Besides, the multi-photon process is a simple single-step structuring process.

The printed circuit board elements according to the invention enable multi-mode or single-mode waveguide data transmissions at extraordinarily high data transfer rates and, at the same time, large design freedom. Such printed circuit board elements may be used in the form of optoelectronic backplanes or flex printed circuit boards, particularly for mobile phones, handhelds and similar electronic computation and communication units. In this respect, a particularly advantageous utilization of the special properties of VCSEL components may comprise the coupling of laser light into embedded waveguides, whereby the low heat tone due to the small power input, the optimum radiation characteristics and a low price are of particular importance.

In the following, the invention will be explained in more detail by way of particularly preferred exemplary embodiments, to which it is, however, not to be restricted, and with reference to the drawing. In the drawing, in detail:

Figure 1B:
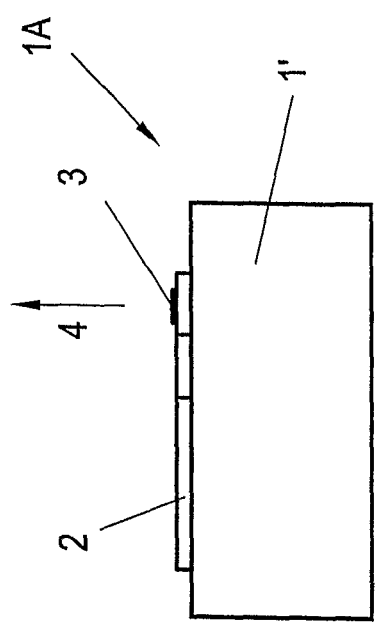
FIGS. 1A and 1B show a top view and an elevational view of a conventional VCSEL component as an example of an optoelectronic component.
Figure 1A:
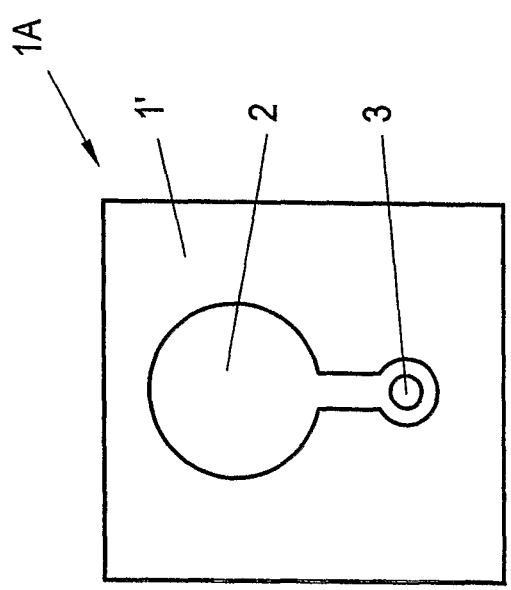

FIGS. 1A and 1B quite schematically show a VCSEL laser component 1A according to the prior art, with a contact surface 2 made, for instance, of gold, in connection with a laser light emission surface 3 being provided on the semiconductor body 1' of the VCSEL component 1A not to be described in detail herein. The radiation direction of the laser beam emitted by the illustrated VCSEL component 1 is indicated by an arrow 4 in FIG. 1B.

Figure 2B:
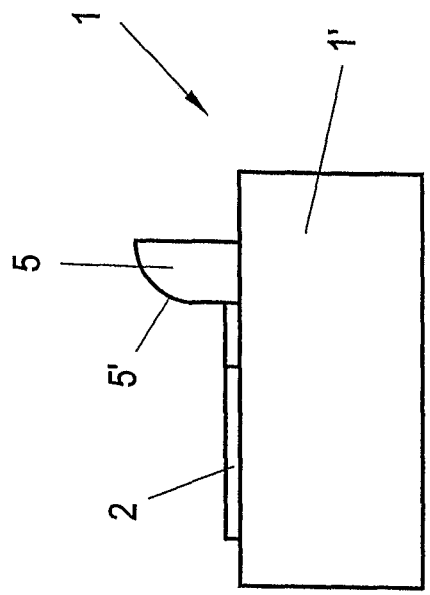
FIGS. 2A and 2B show comparable top and elevational views of a VCSEL component including an integrated deflection mirror according to the invention.
Figure 2A:
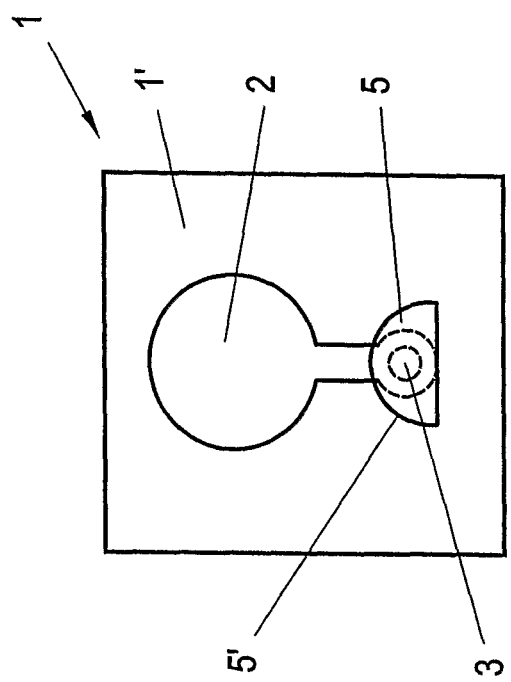

FIGS. 2A (top view) and 2B (side view) depict, in a comparable, likewise quite schematic illustration, a VCSEL component 1 according to the invention—as an example of an optoelectronic component according to the invention, in particular a light-emitting optoelectronic component—, which comprises a semiconductor body 1' and a contact surface 2 made, e.g., of gold, wherein, in FIG. 2, a deflection mirror 5 is, furthermore, arranged above the window-like laser light emission and transmission surface 3 provided in a manner similar to FIG. 1, directly on the VCSEL component 1 or its semiconductor body 1'. In other words, the deflection mirror 5 is located directly above the light transmission surface 3, in the following briefly referred to as emission window 3, such that the laser light generated by the VCSEL component 1 will directly reach said deflection mirror 5 and be deflected as well as bundled by the same, as will be explained in more detail below by way of FIG. 3.

The deflection mirror 5 is made of a transparent material capable of being moulded, such as e.g. an inorganic-organic hybrid polymer commercially known under the name of Ormocer®. Another material suitable for this purpose is silicone. The deflection mirror 5 has approximately the shape of half of a hemisphere as is apparent from a combined view of FIGS. 2A and 2B, and it is mirrored on its outer side or back surface 5'. Such mirroring can, for instance, be realized by the aid of a thin metal layer made, e.g., of gold or silver and having a layer thickness of, in particular, 100 nm to some μm.

The shown mirror surface of the deflection mirror 5, in addition to having the shape of a hemispherial section, may also have any other curved shape, with an aspheric mirror having a radius changing from one point to the other being, in particular, of special advantage for the present purpose to optimally couple laser light into an optical waveguide within a printed circuit board element.

Figure 3:
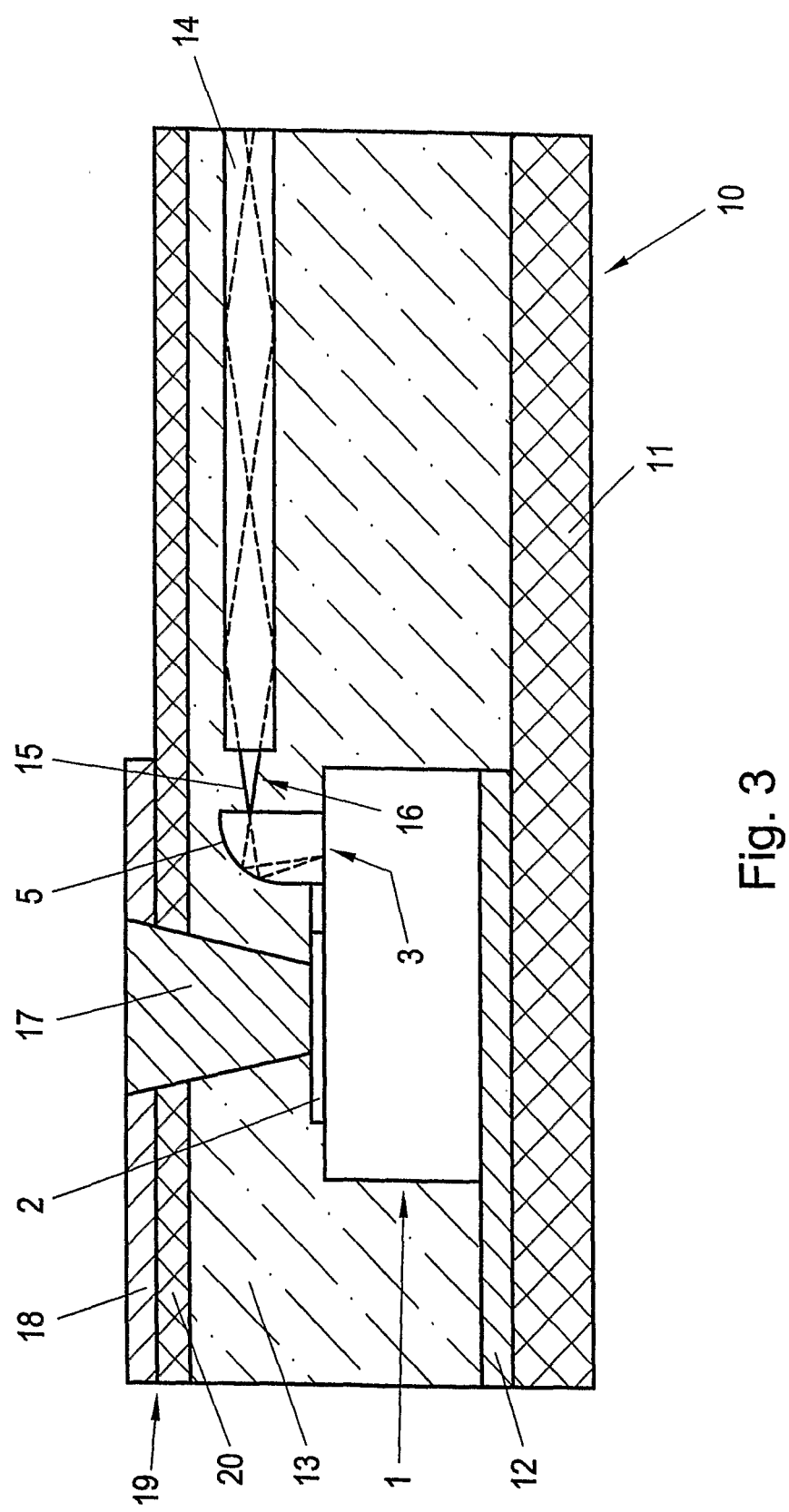
FIG. 3 depicts a schematic cross section through a portion of a printed circuit board element according to the invention, including an optoelectronic component according to the invention, particularly a VCSEL component, and an optical waveguide optically coupled therewith.

Such a printed circuit board element 10 is schematically and sectionally illustrated in FIG. 3. The shown printed circuit board element 10 comprises a printed circuit board substrate 11, e.g. a conventional FR4-substrate or a substrate in the form of a polyimide film if flexible printed circuit board elements are sought. On this substrate 11 is a contact surface 12, particularly in the form of a copper layer, the contact surface in the illustration according to FIG. 3 being shown already after structuring (by a common photo-etching method). On the substrate 11, or above the contact surface 12, is a layer of an optical, photopolymerizable material 13, in which the optoelectronic component (VCSEL component) 1 is embedded. Such embedding may, for instance, be obtained in the manner described in WO 2005/064381 A1 by attaching, e.g. gluing, the component 1 to the substrate 11, or to the contact surface 12, whereupon the optical material of the layer 13 is applied by a conventional method, e.g. by using a doctor blade. After this, a structured optical-fiber-like optical waveguide 14 is produced in the desired region by the selective and controlled irradiation of the optical material of the layer 13 in a manner likewise described in WO 2005/064381, using a two-photon process, into which optical waveguide the laser light 15 emitted from the component 1 and deflected by the deflection mirror 5, and bundled too, is coupled. In doing so, it will not matter if the optical waveguide 14 does not extend as far as directly to the front side of the transparent part of the deflection mirror 5 as illustrated in FIG. 3, but if a small distance 16 is present so as to avoid any risk of adversely affecting the component 1 when structuring the optical waveguide 14 in the optical material of the layer 13, since the indicated deflection and bundling of the laser light 15 will, nevertheless, achieve optimum coupling into the optical waveguide 14. It is, of course, also possible and frequently provided that the optical waveguide 14 is directly conducted to the component 1, i.e. no distance 16 is present, as will also be provided in the embodiment according to FIG. 14 to be elucidated below, besides cf. also WO 2005/064381 A1.

In FIG. 3, the region of the laser emission window 3 is, furthermore, schematically indicated, and also the upper contact surface 2 of the VCSEL component 1 is shown, which, for instance via a micro-via laser bore (μ-via laser bore) 17, is in electric connection with a contact surface 18 of an upper printed circuit board layer 19 comprised of said contact surface 18 (again made e.g. of copper)—which, in FIG. 3, is shown in an already structured manner—and a, for instance comparatively thin, substrate, or an insulation and adhesive layer 20, e.g. an epoxy resin layer. The shown printed circuit board element 10 has, thus, a multilayer structure, wherein two insulation layers provided with conductive surfaces are provided, and wherein the contact layers were lithographically structured in a known manner to obtain the contact surfaces and conductive tracks 12, 18. In the configuration illustrated in FIG. 3, the VCSEL component 1 has a lower contact surface which is electrically connected with the contact surface 12 and the upper contact surface 2 which is connected with the upper contact surface 18 via a μ-via laser bore 17. Instead, it is, of course, also possible that the VCSEL component 1 comprises both contact surfaces on one of its surfaces and is, thus, contacted from top, via two μ-via laser bores comparable to the μ-via laser bores 17 in FIG. 3, with separate conductive tracks or contact surfaces provided on the upper side of the printed circuit board element 10, cf. also FIG. 15. In this case, the VCSEL component 1 can also be provided on a heat dissipation layer made, for instance, of copper, on the substrate 11, as explained in WO 2005/064381 A. On the other hand, the component 1 can also comprise both contacts on its lower side (flip-chip technology) and, thus, be contacted onto the substrate 11 by the aid of soldering balls. In this manner, the component 1 is completely contacted already during insertion, thus requiring no μ-vias, cf. FIG. 14.

It is, moreover, also conceivable that, in the event of the configuration according to FIG. 3, the upper contact surface or conductive layer 18 is directly applied on the layer 13 of the optical, photopolymerizable material by an addition method known per se, such that no insulation and adhesive layer 20 is required and, in particular, also the upper, single printed circuit board element 19 can be obviated.

It is of particular relevance that the optoelectronic component, i.e., in particular, the VCSEL or photodiode component 1, in the present assembly comprises an integrated deflection mirror 5 which not only deflects the laser beam 15 by 90°, as is apparent from FIG. 3, but also bundles the laser beam 15, i.e. exerts a lens effect, to thereby optimize the coupling of the laser light into the optical waveguide 14.

In order to produce an integrated deflection mirror 5 on such a component 1, a technique as illustrated in FIGS. 4 to 13 is preferably used, wherein it is proceeded in a manner similar to the replication method known per se for the production of microlenses on VCSELs, cf., for instance, EP 1 512 993 A1 and EP 1 460 738 A2. The present technique, however, additionally provides for the mirroring of the optical structures or assemblies (i.e. deflection mirror) by a coating process, e.g. by vapor deposition, as will be explained below by way of FIGS. 11 and 12.

Figure 4:
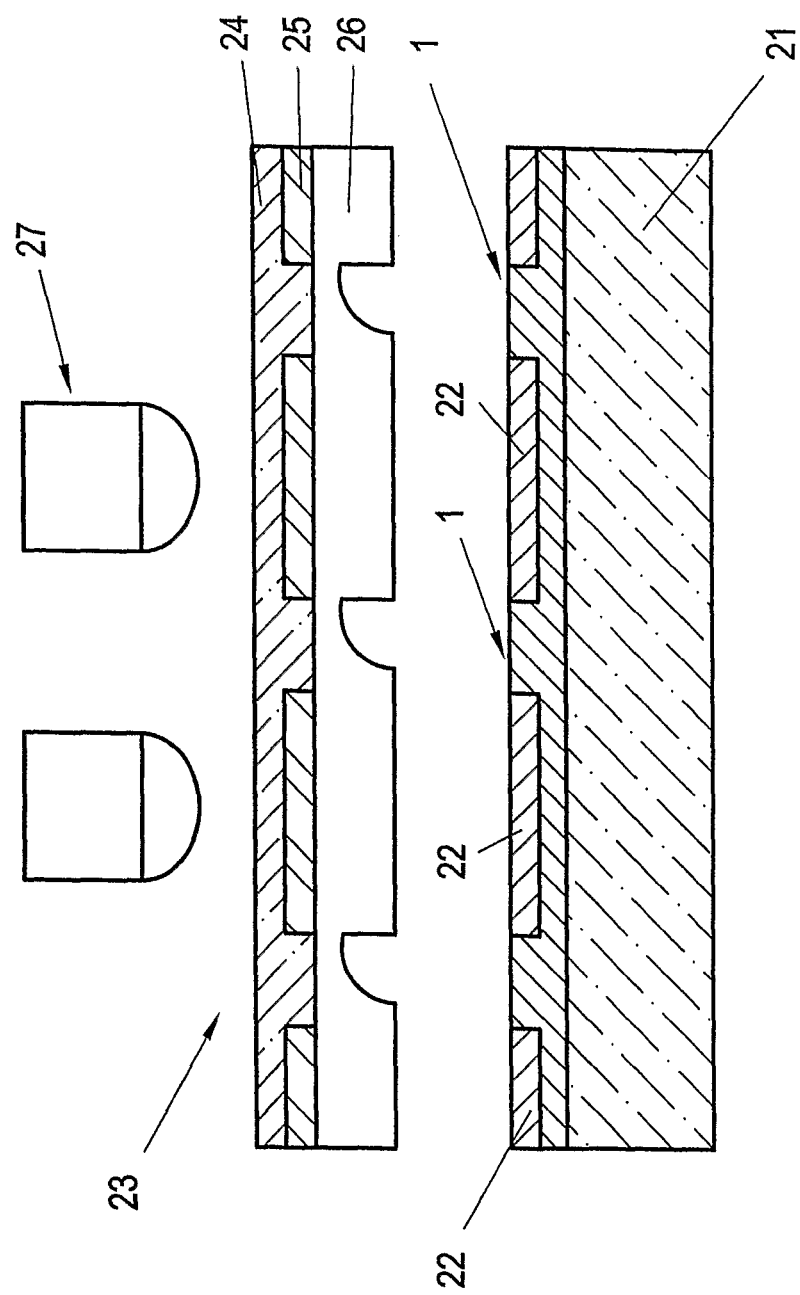
FIGS. 4 to 13 depict various steps in the production of integrated deflection mirrors on VCSEL components provided on a semiconductor wafer according to a replication method known per se, yet also comprising the mirroring of the deflection mirrors as opposed to the known method.

In detail, a wafer 21 is apparent from FIG. 4, which carries already prefabricated optoelectronic components 1, i.e., in particular, VCSEL components 1, between which contact regions 22 are provided to separate the components 1. A mask substrate 23 comprising, in detail, a UV-transparent substrate 24, a UV-impermeable structure 25 arranged therein as well as a UV-transparent mold 26 is shown in FIG. 4 at a distance from the wafer 21 above the same. Above the mask 23, a microscope 27 is, in turn, schematically illustrated, which is used to effect a preadjustment of the mask 23 relative to the wafer 21.

Figure 5:
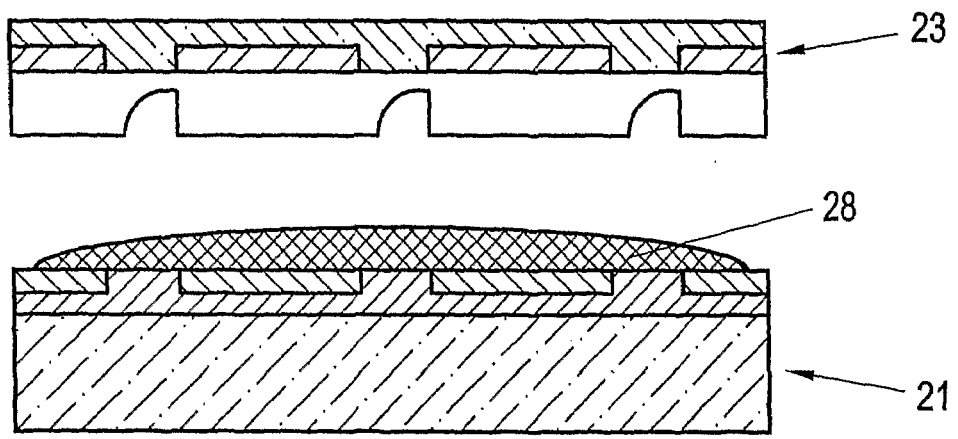

FIG. 5 depicts an optical replication material 28 schematically assigned to the wafer 21, with a superimposed mask 23, which replication material 28 is preferably comprised of a sol-gel material dispersion as known per se.

Figure 6:
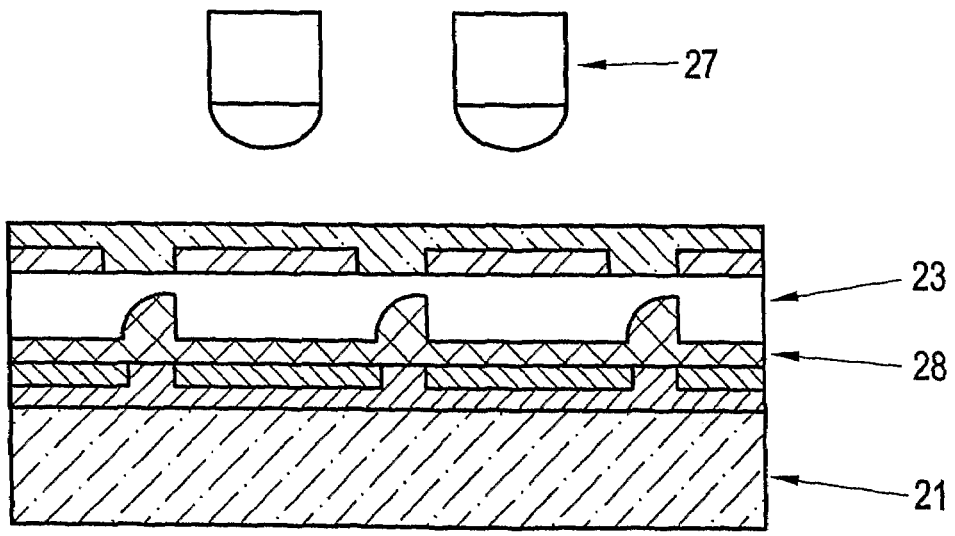

FIG. 6 illustrates the assembly of the wafer 21, the optical replication material 28 and the mask 23 with the microscope 27, wherein a precise orientation of the mask 23 and the wafer 21 relative to each other is performed by the aid of the microscope 27.

Figure 7:
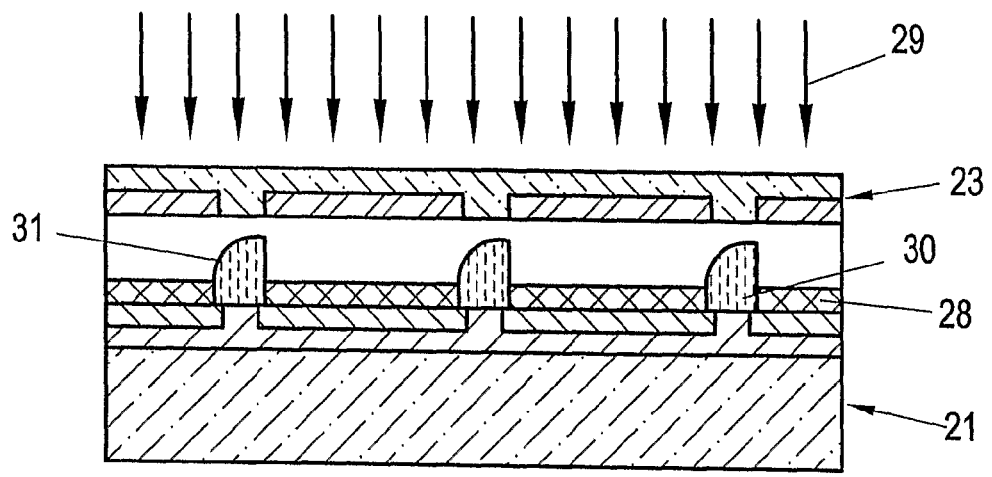

After this, an exposure of the sol-gel material, i.e. the optical replication layer 28, to light is effected in accordance with FIG. 7 by directing UV light 29 through the mask 23, wherein exposed regions 30 are shown, which will form the desired deflection mirrors 5 (cf. FIGS. 2 and 3). By the exposure to UV light 29 as in accordance with the arrows in FIG. 7, the optical replication material 28 is cured in the exposed regions 30.

Figure 8:
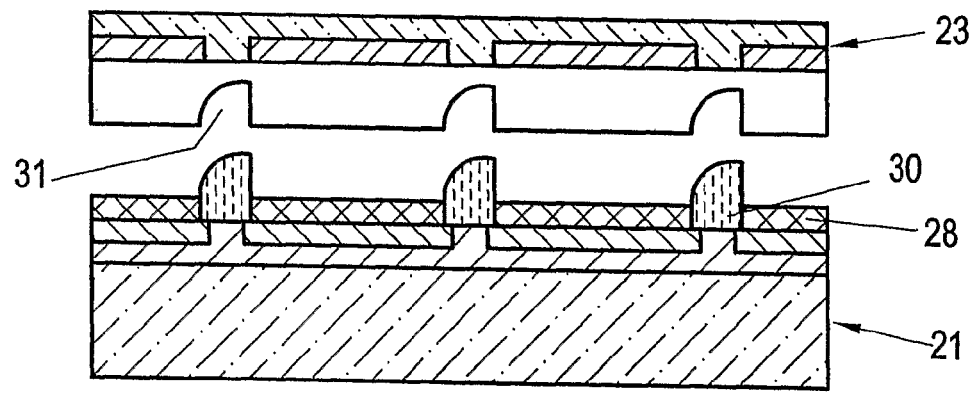

Subsequently, removal from the mold will be realized by lifting the mask 23 from the wafer 21, and the regions 30 formed by exposing and curing will then be cleaned in a per se conventional manner, as will the mold 31, cf. FIG. 8.

Figure 9:
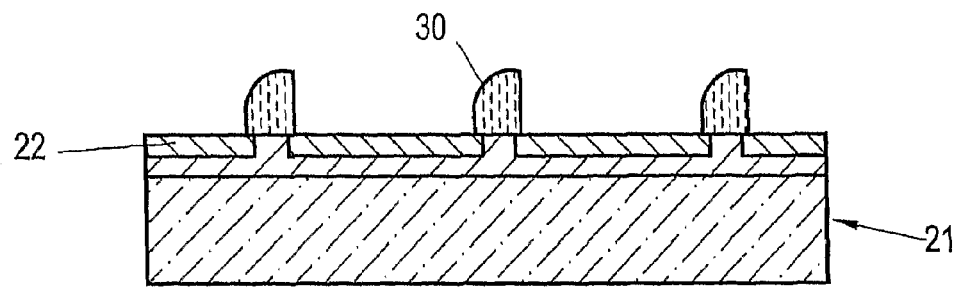

After this, structuring in a photo-etching process takes place as in accordance with FIG. 9, FIG. 9 illustrating the structure after the development (etching, washing) of the unexposed optical replication material 28.

Figure 10:
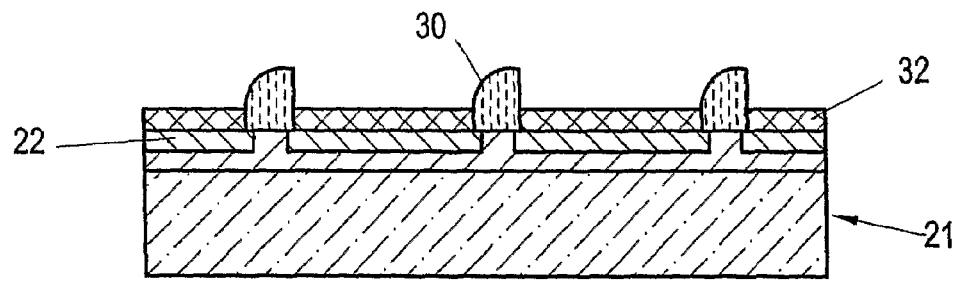

In FIG. 10, a photoresist structure 32 applied on the wafer 21 by photolithography is illustrated, which serves to mask the metallic contact regions 22 during a subsequent coating procedure.

Figure 11:
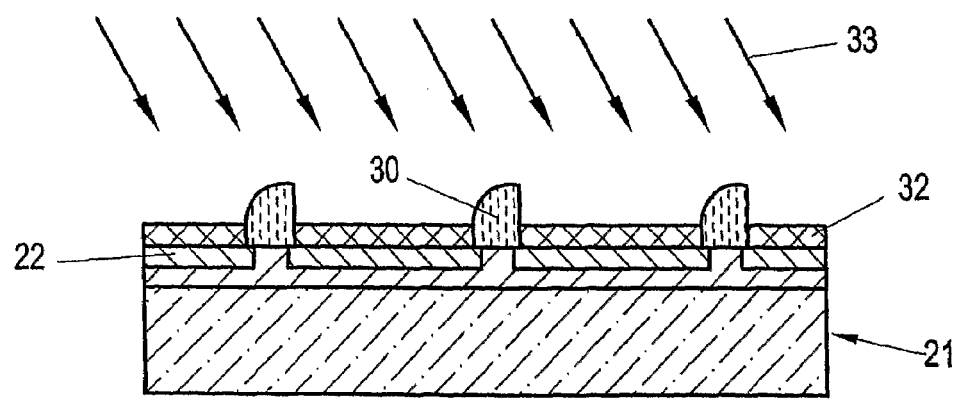
Figure 12:
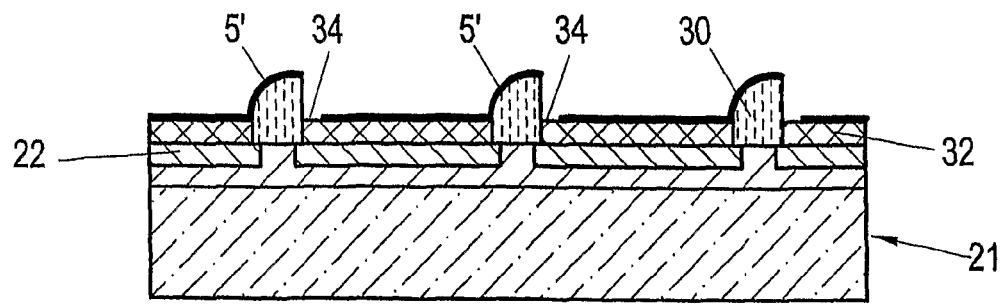

In detail, the previously exposed and UV-cured regions 30 of the replication material are then coated, for instance as schematically illustrated in FIG. 11, by vapor deposition (with gold or silver) on the curved outer sides or back surfaces of the regions 30, the direction of vapor deposition being oblique as indicated by arrows 33 in FIG. 11. In this manner, the structure provided with the mirroring or metal layer 5' according to FIG. 12 is obtained, from which it is also apparent that, due to the shadow effect of the transparent regions 30, no vapor has been deposited on parts 34 of the photoresist structure 32.

Figure 13:
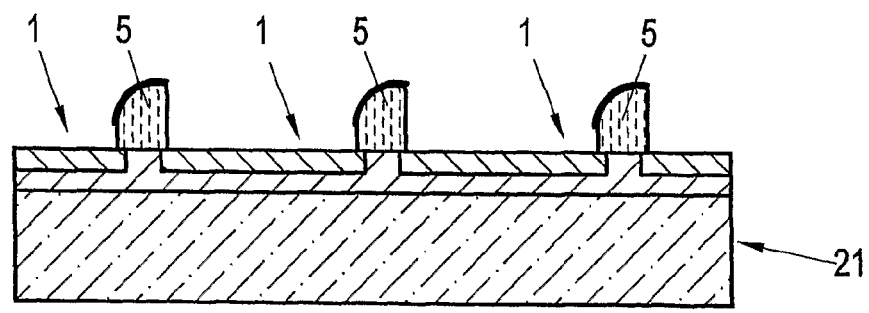

FIG. 13 at last depicts the final configuration of the wafer 21 with the (VCSEL) components 1 plus deflection mirrors 5, which was obtained after the removal of the photoresist structure 32. From this wafer 21, the individual components 1 are finally obtained by cutting in a per se conventional manner, such a (VCSEL) component 1 being illustrated in FIGS. 2 and 3.

Materials to be used for the deflection mirror 5 also include transparent thermoplastic or duroplastic materials such as, e.g., polycarbonate, polymethylmethacrylate or polystyrene, or cured epoxy or polyester resins. When using such a material, the irradiation with UV light 29 according to FIG. 7 can be obviated when producing the deflection mirror on top of the optoelectronic components provided on the wafer 21.

Figure 14:
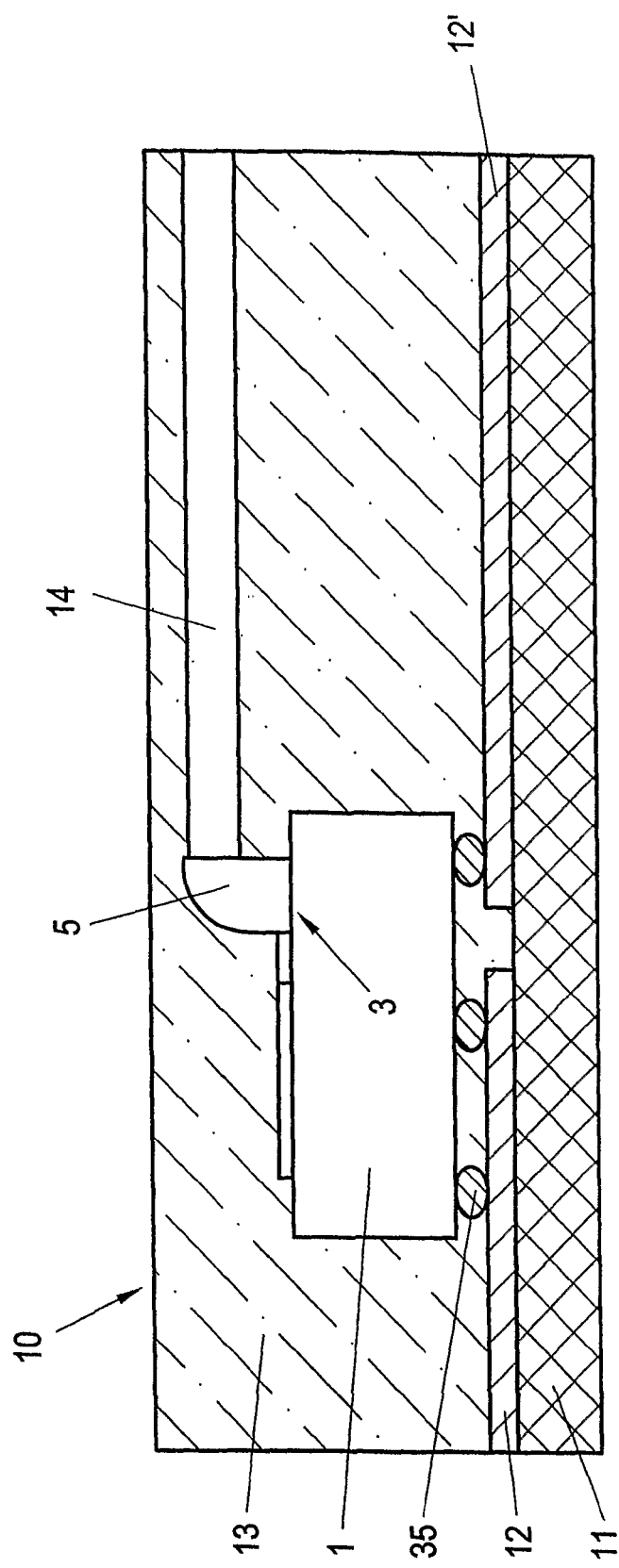
FIG. 14 shows a modified embodiment of a printed circuit board element including an optoelectronic component in a schematic, sectional illustration similar to that of FIG. 3.

In FIG. 14, a printed circuit board element 10 is shown in a sectional illustration similar to that of FIG. 3, wherein, as opposed to FIG. 3, an optoelectronic component 1, in particular a VCSEL component 1, is provided with two contact surfaces (not illustrated in detail) on its lower side facing the substrate 11. Via these contact surfaces, the electric contact to contact surfaces, in particular copper surfaces, 12 and 12' is produced on the substrate 11 by the aid of soldering balls 35. On its upper side, the component 1 is free of contact surfaces, and, as in correspondence with the configuration according to FIG. 3, a deflection mirror 5 is again provided on this upper side of the component 1 above the light transmission surface 3. This deflection mirror 5 can again be configured in a manner similar to that previously explained by way of FIGS. 4 to 13, yet it can also be made of a thermosetting material, i.e. a thermoplast or even a duroplast, with the appropriate transparency, as mentioned above.

Furthermore, FIG. 14 again depicts the optical layer 13 with the waveguide 14 structured therein by the aid of a TPA process, said waveguide 14 now exemplarily extending directly as far as to the end side of the deflection mirror 5, i.e. the distance 16 shown in FIG. 3 has been omitted in the embodiment according to FIG. 14.

Figure 15:
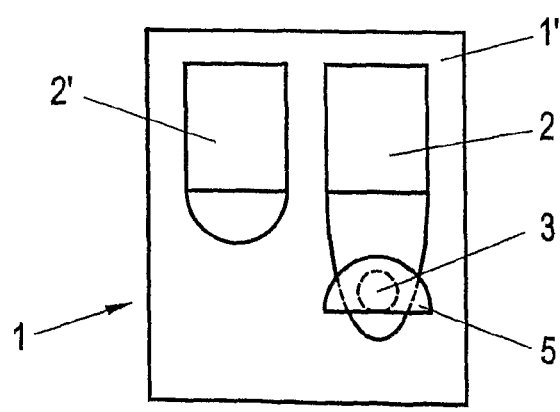
FIG. 15 depicts a top view similar to that of FIG. 2A, on a modified optoelectronic component, namely a VCSEL component, with two contact surfaces on its upper side.

Finally, in FIG. 15, a VCSEL component 1 is illustrated in a schematic top view similar to that of FIG. 2A, wherein it is apparent that two contact surfaces 2, 2' are provided on the visible upper side of the component 1, i.e. on its semiconductor body 1', namely an anode 2 and a cathode 2'. Furthermore, the, for instance, circular emission window 3, i.e. generally the light transmission surface 3, is again apparent from this top view of FIG. 15, the deflection mirror 5 visible in top view being again provided thereabove.

Although VCSEL components have been described in the foregoing as optoelectronic components particularly preferred in the context of the invention, it will be appreciated that also other optoelectronic components (light emitters as well as light receivers) such as, in particular, photodiodes can be used.

The invention claimed is:

1. An optoelectronic component device comprising an optoelectronic component which includes a light transmission surface and a deflection minor made of an optically transparent material and having a mirrored back surface, and deflecting the passing light radiation by a predetermined angle, wherein the optoelectronic component is carried by a wafer substrate and the deflection minor which comprises a material apt for molding and curing is obtained by directly molding on the light transmission surface of the optoelectronic component, the optoelectronic component device, thus, being an integral device, wherein the deflection minor is attached and directly located over the light transmission path of the optoelectronic component, and wherein the deflection mirror is smaller than the optoelectronic component and has a curved surface that couples light directly to an optical waveguide.

2. A printed circuit board element including at least one optoelectronic component according to claim 1, wherein the component is embedded in an optical photopolymerizable layer material, and at least one optical waveguide is optically coupled thereto, which optical waveguide is structured in the optical, photopolymerizable material by photon irradiation, and wherein the deflection mirror deflects the light radiation from the component to the optical waveguide, or vice versa.

3. A printed circuit board element according to claim 1, wherein the deflection minor is designed as a light-radiation focusing refractive minor or concave mirror.

4. A printed circuit board element according to claim 1, wherein the deflection mirror is comprised of an optically transparent material having a mirrored back surface.

5. A printed circuit board element according to claim 1, wherein the deflection mirror is an aspheric mirror.

6. A printed circuit board element according to claim 1, wherein the structured optical waveguide ends at a distance in front of the deflection mirror.

7. An optoelectronic component device according to claim 1, wherein the deflection mirror is designed as a light-radiation focussing focusing refractive mirror or concave mirror.

8. An optoelectronic component device according to claim 7, wherein the deflection minor has a focus length of 5000 μm at most.

9. An optoelectronic component device according to claim 1, wherein the mirrored back surface is formed by a metal layer.

10. An optoelectronic component device according to claim 9, wherein the mirrored back surface is formed by one of gold and silver.

11. An optoelectronic component device according to claim 1, wherein the transparent material is a UV-curing material.

12. An optoelectronic component device according to claim 11, wherein the UV-curing material is selected from the group comprising a silicone or an inorganic-organic hybrid polymer, an organically modified ceramics material, a hybrid polymer based on silicone, an organic polymer, and glass or ceramics.

13. An optoelectronic component device according to claim 1, wherein the deflection minor is made of a transparent thermoplastic material.

14. An optoelectronic component device according to claim 13, wherein the transparent thermoplastic material of the deflection minor is selected from the group comprising polycarbonate, polymethylmethacrylate, polystyrene, and cured epoxy or polyester resins.

15. A component according to claim 1, wherein the deflection mirror is made of a transparent duroplastic material.

16. An optoelectronic component device according to claim 15, wherein the transparent duroplastic material of the deflection minor is selected from the group comprising polycarbonate, polymethylmethacrylate, polystyrene, and cured epoxy or polyester resins.

17. An optoelectronic component device according to claim 1, wherein the deflection minor is an aspheric minor.

18. An optoelectronic component device according to claim 1, wherein the deflection minor deflects the light radiation by 90°.

19. An optoelectronic component device according to claim 1, wherein the optoelectronic component comprises a VCSEL component.

20. An optoelectronic component device according to claim 1, wherein the optoelectronic component comprises a photodiode.

* * * * *

UNITED STATES PATENT AND TRADEMARK OFFICE
CERTIFICATE OF CORRECTION

| | |
|---|---|
| PATENT NO. | : 8,417,078 B2 |
| APPLICATION NO. | : 12/297066 |
| DATED | : April 9, 2013 |
| INVENTOR(S) | : Riester et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 201 days.

Signed and Sealed this
Twenty-seventh Day of January, 2015

Michelle K. Lee
*Deputy Director of the United States Patent and Trademark Office*